(12) United States Patent
Maruyama et al.

(10) Patent No.: US 6,504,188 B1
(45) Date of Patent: Jan. 7, 2003

(54) SOLID STATE IMAGE PICKUP DEVICE

(75) Inventors: Yasushi Maruyama, Kanagawa (JP); Dai Sugimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/708,811

(22) Filed: Nov. 8, 2000

(30) Foreign Application Priority Data

Nov. 8, 1999 (JP) .......................................... 11-317109

(51) Int. Cl.⁷ ............................................. H01L 29/768
(52) U.S. Cl. ........................ 257/222; 257/225; 257/294; 257/432; 257/435; 257/443
(58) Field of Search ............................... 257/222, 432, 257/435, 443, 225, 294

(56) References Cited

U.S. PATENT DOCUMENTS

| | | | |
|---|---|---|---|
| 5,796,154 A | * | 8/1998 | Sano et al. .................. 257/432 |
| 6,030,852 A | * | 2/2000 | Sano et al. .................... 438/69 |
| 6,252,216 B1 | * | 6/2001 | Ohashi ..................... 250/208.1 |
| 6,255,640 B1 | * | 7/2001 | Endo et al. ............... 250/208.1 |

* cited by examiner

Primary Examiner—Amir Zarabian
Assistant Examiner—Douglas Menz
(74) Attorney, Agent, or Firm—Sonnenschein, Nath & Rosenthal

(57) ABSTRACT

A solid image pickup device that can be operated at high speed and can suppress the dark current with high sensitivity, and a process for producing the same are provided. The solid image pickup device comprises a shunt wiring layers 7a and 7d of the transfer electrodes are formed with an accumulated film of a high melting point metal 13 and a nitride or an oxide of a high melting point metal 14. The solid image pickup device is produced by the process comprising a step of forming, on transfer electrodes 3a and 4b, shunt wiring layers 7a and 7d comprising an accumulated film comprising a nitride layer or an oxide layer of a high melting point metal 14 having a high melting point metal layer 13 formed thereon, and a step of conducting, after forming a dielectric film 36 to have a concave part on a sensor 2, a heat treatment at a temperature of from 800 to 900° C.

6 Claims, 6 Drawing Sheets

SOLID STATE IMAGE PICKUP DEVICE

RELATED APPLICATION DATA

The present application claims priority to Japanese Application No. P11-317109 filed Nov. 8, 1999, which application is incorporated herein by reference to the extent permitted by law.

BACKGROUND OF THE INVENTION

1. Field of the Invention

The present invention relates to a solid image pickup device comprising a transfer electrode having a shunt wiring layer formed thereon, and a process for producing the same.

2. Description of the Related Art

Polycrystalline silicon is generally used as a transfer electrode of a solid image pickup device.

Because polycrystalline silicon of the transfer electrode has high resistance, propagation delay is caused, and therefore it is difficult to realize high-speed operation of the image pickup device and an image pickup device having a large area.

In order to solve the problems, such a constitution has been proposed that a wiring layer formed with a metal having low resistance, i.e., a so-called shunt wiring layer, is formed on the transfer electrode through a dielectric film, and the shunt wiring layer is connected to the transfer electrode via a contact part. Because the propagation occurs through the shunt wiring layer of low resistance by using the constitution, high-speed operation can be realized.

A cross sectional view of the vicinity of a photo sensor unit of a CCD solid image pickup device is shown in FIG. 6 as an example of a solid image pickup device using a shunt wiring layer.

The CCD solid image pickup device 50 comprises a semiconductor substrate 51 having formed thereon a photo sensor unit containing a photodiode, a vertical charge transfer unit transferring a charge, a readout unit conducting readout a signal charge between the photo sensor unit and the vertical charge transfer unit and a channel stop region separating from the adjacent pixels, and a transfer electrode 53 is formed on the region other than the photo sensor unit through a dielectric film 54. FIG. 6 shows a cross section of a part where two of the transfer electrodes 53 overlap each other through the dielectric film 54.

A shunt wiring layer 56 formed with a metal, such as aluminum and a high melting point metal, is arranged on the transfer electrode 53 through the dielectric film 54.

A buffer layer (buffer wiring) 55 is provided between the shunt wiring layer 56 and the transfer electrode 53, and the buffer layer 55 is connected to the transfer electrode 53 and the shunt wiring layer 56, respectively, via contact parts not shown in the figure.

A light shielding layer 57 covering the entirety is formed on the shunt wiring layer 56 through the dielectric film 54. The light shielding layer 57 has an opening 52 formed on the photo sensor unit and is formed to cover the image pickup region other than the opening 52.

Furthermore, an on-chip lens 59 is formed on the light shielding layer 57 through a dielectric layer 58 having a smoothened surface, so as to condense incident light, which is directed to the opening 52.

In the CCD solid image pickup device 50, the shunt wiring layer 56 is connected to the transfer electrode 53 via the buffer layer 55 to lower the resistance of the transfer electrode 53, whereby the propagation velocity is improved.

However, when a high melting point metal, such as tungsten, is used in the shunt wiring layer 56, such a problem is caused by a heat treatment conducted after the formation of the dielectric film on the light shielding layer 57 that the contact resistance between the shunt wiring layer 56 and the transfer electrode (accumulation electrode) 53 is increased in the constitution where the shunt wiring layer 56 and the transfer electrode 53 is directly connected without the buffer layer 55, and the contact resistance between the shunt wiring layer 56 and the buffer layer 55 is increased in the constitution shown in FIG. 6.

The increase in contact resistance is mainly caused by the following factor. The polycrystalline silicon of the buffer layer or the transfer electrode and the high melting point metal are reacted by the heat treatment to form a silicide layer at the contact part, and the volume is increased in forming the silicide layer to lift the shunt wiring layer 56, so as to form a gap at the contact part with the buffer layer or the transfer electrode.

On the other hand, when Al is used in the shunt wiring layer 56, the heat treatment cannot be conducted at a high temperature because the Al is melted when a heat treatment at a high temperature is conducted after the formation of the dielectric film on the light shielding layer 57.

Therefore, defects caused by damages of the silicon substrate 51 received in pattering the light shielding layer 57 cannot be sufficiently recovered, so as to increase the dark current.

The dielectric layer on the shunt wiring layer 56 is necessarily a dielectric film that can be formed at a low temperature, and in order to sufficiently ensure the coverage and the withstand voltage of the dielectric film, it is necessary to form the dielectric film with a large thickness. Therefore, such a problem is caused that the film thickness from the surface of the silicon substrate 51 to the upper end of the light shielding layer 57 is increased to lower the utilization efficiency of light, whereby the sensitivity is deteriorated.

SUMMARY OF THE INVENTION

In order to solve the problems associated with the conventional techniques, an object of the invention is to provide a solid image pickup device that can be operated at high speed and can suppress the dark current with high sensitivity, and a process for producing the same.

The invention relates to a solid image pickup device comprising plural sensor units formed on a substrate, a transfer electrode provided among the sensor units on the substrate, and a shunt wiring electrically connected to the transfer electrode, the shunt wiring comprising a high melting point metal layer and a layer comprising a nitride or an oxide of a high melting point metal.

The invention also relates to a process for producing a solid image pickup device comprising a step of forming a transfer electrode on a substrate having sensor units formed thereon, a step of forming, on the transfer electrode, a shunt wiring layer comprising a layer comprising a nitride or an oxide of a high melting point metal and formed thereon a high melting point metal layer, and a step of conducting, after forming a dielectric film to have concave parts on the sensor units, a heat treatment at a temperature of from 800 to 900° C. or a heat treatment to subject the dielectric film to reflow.

According to the constitution of the invention, because the shunt wiring of the transfer electrode is formed with an accumulated film of a high melting point metal and a nitride or an oxide of a high melting point metal, the resistance of the transfer electrode is lowered by the shunt wiring, and a heat treatment at a high temperature can be conducted owing to the use of the high melting point metal.

According to the production process of the invention, because the heat treatment is conducted at a temperature of from 800 to 900° C., defects on the surface of the substrate can be recovered.

Furthermore, because the shunt wiring layer is formed with the accumulated film comprising a nitride layer or an oxide layer of a high melting point metal having a high melting point metal layer formed thereon, the reaction between the transfer electrode and the shunt wiring layer on conducting the heat treatment can be suppressed, and the increase of the contact resistance to the transfer electrode is suppressed to decrease the resistance of the transfer electrode.

DESCRIPTION OF THE PREFERRED EMBODIMENTS

Figure 1:
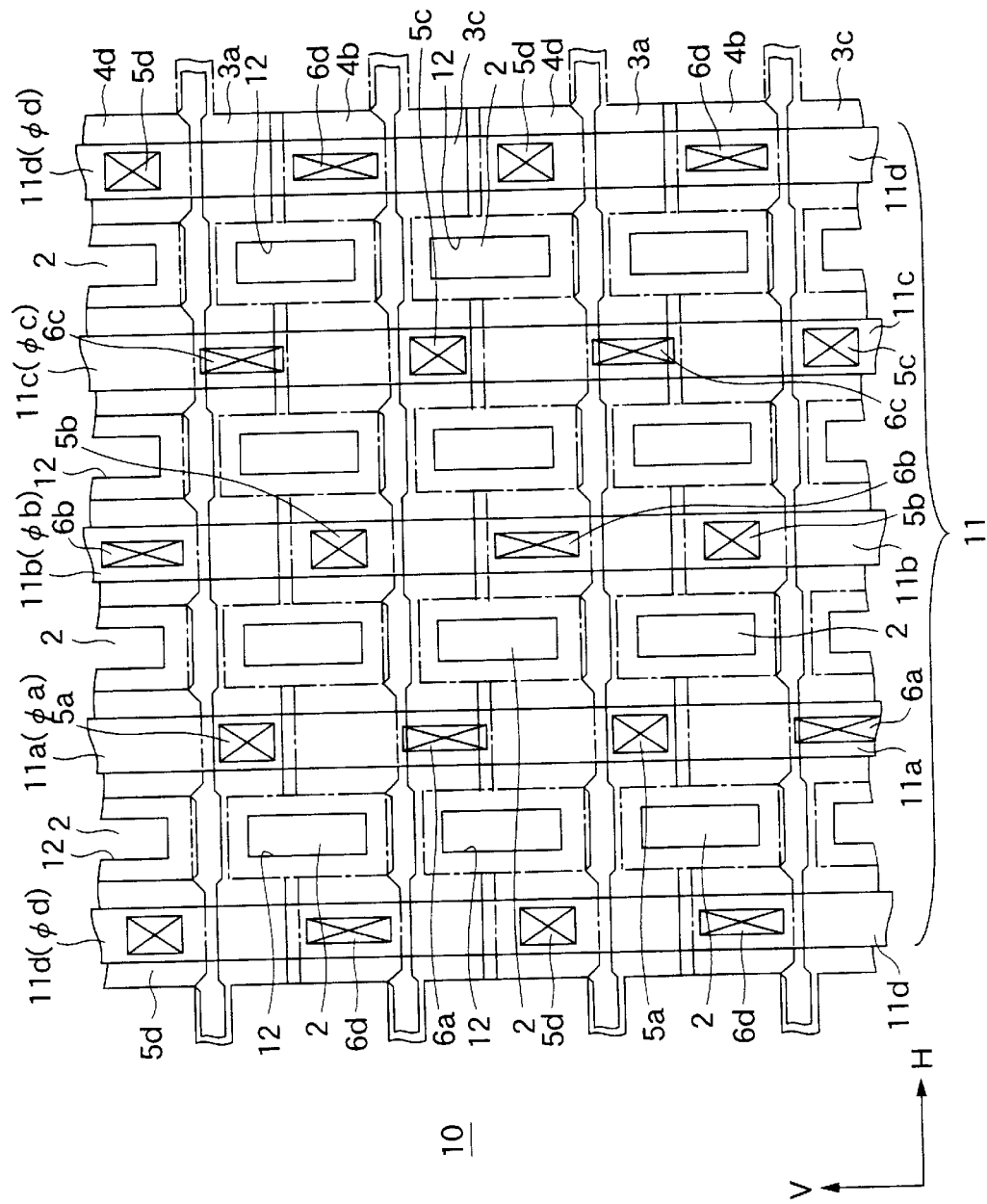
FIG. 1 is a schematic constitutional view (plan view) of a solid image pickup device of an embodiment of the invention

The invention relates to a solid image pickup device having a shunt wiring of a transfer electrode, and the shunt wiring comprises an accumulated film of a high melting point metal and a nitride or an oxide of a high melting point metal.

The invention also relates to such a constitution that the image pickup device of the invention has an intralayer lens on the sensor.

The invention also relates to a process for producing a solid image pickup device comprising a step of forming, on a transfer electrode, a shunt wiring layer formed with an accumulated film comprising a nitride layer or an oxide layer of a high melting point metal having a high melting point metal layer formed thereon, and a step of conducting, after forming a dielectric layer having a concave part on the sensor, conducting a heat treatment at a temperature of from 800 to 900° C.

The invention also relates to the process for producing a solid image pickup device that further comprises a step of forming an intralayer lens by forming, on the dielectric film, a film of a material that has a larger refractive index than the dielectric film.

The transfer electrode can be formed with, for example, a polycrystalline silicon layer.

The shunt wiring layer can be formed with an accumulated film of a high melting point metal layer, such as tungsten, and a nitride or an oxide of the high melting point metal.

The buffer layer can be formed with, for example, a polycrystalline silicon layer.

The buffer layer can also be formed with, for example, a polycide layer comprising a polycrystalline silicon layer and a metallic silicon compound, such as a silicide of the high melting point metal, e.g., tungsten silicide. In this case, the polycrystalline silicon layer of the polycide layer is connected to the polycrystalline silicon layer of the transfer electrode, and the metallic silicon compound layer of the polycide is connected to the shunt wiring layer.

The transfer electrode and the buffer layer is connected through a contact hole opening in the dielectric film therebetween, and the buffer layer and the shunt wiring layer is connected through a contact hole opening in the dielectric film therebetween. In this case, it is preferred that the contact part of the transfer electrode and the buffer layer and the contact part of the buffer layer and the shunt wiring are formed at such positions that are remote from each other.

FIGS. 1 to 4 are schematic constitutional diagrams of a solid image pickup device of one embodiment of the invention.

The embodiment shown in FIGS. 1 to 4 is a CCD solid image pickup device of a flame interline type, to which the invention is applied.

The CCD solid image pickup device 10 is driven through four phases, and two polycrystalline silicon layers function as a transfer electrode (accumulation electrode). That is, the clock signal of the first phase φa or the clock signal of the third phase φc is applied to the polycrystalline silicon layer of the first layer through the shunt wiring layer and the buffer layer (buffer wiring), and the clock signal of the second phase φb or the clock signal of the fourth phase φd is applied to the polycrystalline silicon layer of the second layer through the shunt wiring layer and the buffer layer (buffer wiring).

The layout will be described with reference to FIG. 1. In the figure, the direction V is the transfer direction of the charge, and the direction H is the transfer direction of the horizontal register not shown in the figure. In FIG. 1, the shunt wiring layer 7 is not shown.

The plural buffer layers 11a, 11b, 11c and 11d are provided in a substantially linear pattern in the V direction, and beneath the buffer layers 11 (11a, 11b, 11c and 11d) and under transfer electrodes 3 (3a and 3c) and 4 (4b and 4d), vertical charge transfer units (not shown in the figure) constituting a vertical CCD register are arranged. The shunt wiring layers 7 are formed on each of the buffer layers 11a, 11b, 11c and 11d in the substantially linear pattern.

Sensor units 2 separated to each pixel are formed between the vertical charge transfer units. The sensor unit 2 is formed with, for example, a photodiode, and on the sensor unit 2, a window part 12 of the light shielding layer 8 is provided that opens in a rectangular shape with the longitudinal direction in the V direction.

Channel stop regions (not shown in the figure) are formed on the right side in the figure of sensor units 2, and channel stop regions and readout parts (not shown in the figure) are formed on the left side in the figure of the sensor units 2.

In the CCD solid image pickup device 10, the transfer layers 3 and 4 are constituted with the polycrystalline silicon layers of the first layer 3a and 3c and the polycrystalline silicon layers of the second layer 4b and 4d. The polycrystalline silicon layers 3a, 3c, 4b and 4d of the first and second layers are laid with the longitudinal direction in the H direction and are formed in such a pattern that is widened on the vertical charge transfer part and is narrowed between the sensor units 2.

Figure 2:
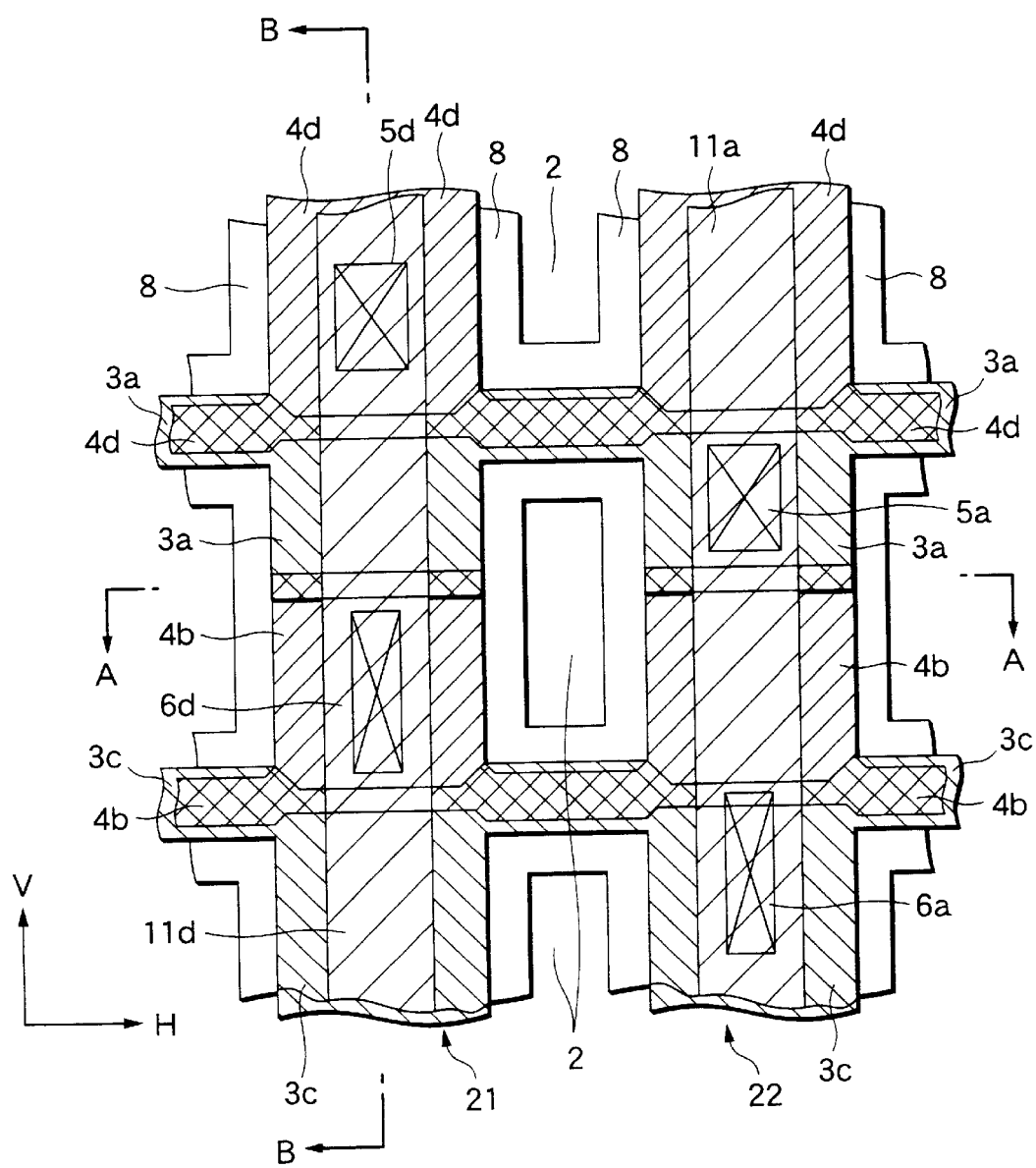
FIG. 2 is an enlarged view of an important part of FIG. 1.

In the V direction in FIG. 2, the polycrystalline silicon layer 3a of the first layer, the polycrystalline silicon layer 4b of the second layer, the polycrystalline silicon layer 3c of the first layer and the polycrystalline silicon layer 4d of the second layer are formed to surround the sensor unit 2, and the polycrystalline silicon layers of the first layer 3a and 3c and the polycrystalline silicon layers of the second layer 4b and 4d are arranged in such a manner that the edges of the two polycrystalline layers 3, 4 overlap each other in a region between the sensor units 2 and in a part of the vertical charge transfer part.

The clock signal φa of the first phase is supplied to the polycrystalline silicon layer of the first layer 3a through the shunt wiring layer 7 and the buffer layer 11a, and the clock signal of the second phase φb is supplied to the polycrystalline silicon layer 4b of the second layer through the shunt wiring layer 7 and the buffer layer 11b. The clock signal φc of the third phase is supplied to the polycrystalline silicon layer of the first layer 3c through the shunt wiring layer 7 and the buffer layer 11c, and the clock signal of the fourth phase φd is supplied to the polycrystalline silicon layer of the second layer 4d through the shunt wiring layer 7 and the buffer layer 11d.

In FIG. 1, the contact of the transfer electrode of the polycrystalline silicon layers of the first layer 3a and 3c or the polycrystalline silicon layers of the second layer 4b and 4c with the buffer layers 11 (11a, 11b, 11c and 11d) is accomplished by contact holes 5a, 5b, 5c and 5d, respectively, and the contact of the buffer layers 11 and the shunt wiring layers 7 not shown is accomplished by contact holes 6a, 6b, 6c and 6d, respectively.

As shown in FIG. 1, the positions of the contact holes 5a, 5b, 5c and 5d of the transfer electrodes 3 and 4 and the buffer layers 11 are arranged in a slant direction, in which when it is staggered by one vertical charge transfer part in the H direction, it is staggered by one transfer electrode in the V direction.

The positions of the contact holes 6a, 6b, 6c and 6d of the buffer layers 11 and the shunt wiring layers 7 are staggered by about two transfer electrode from the contact holes 5a, 5b, 5c and 5d of the transfer electrodes 3 and 4 and the buffer layers 11 corresponding to the same buffer layer 11, and are similarly arranged in the slant direction.

Figure 3:
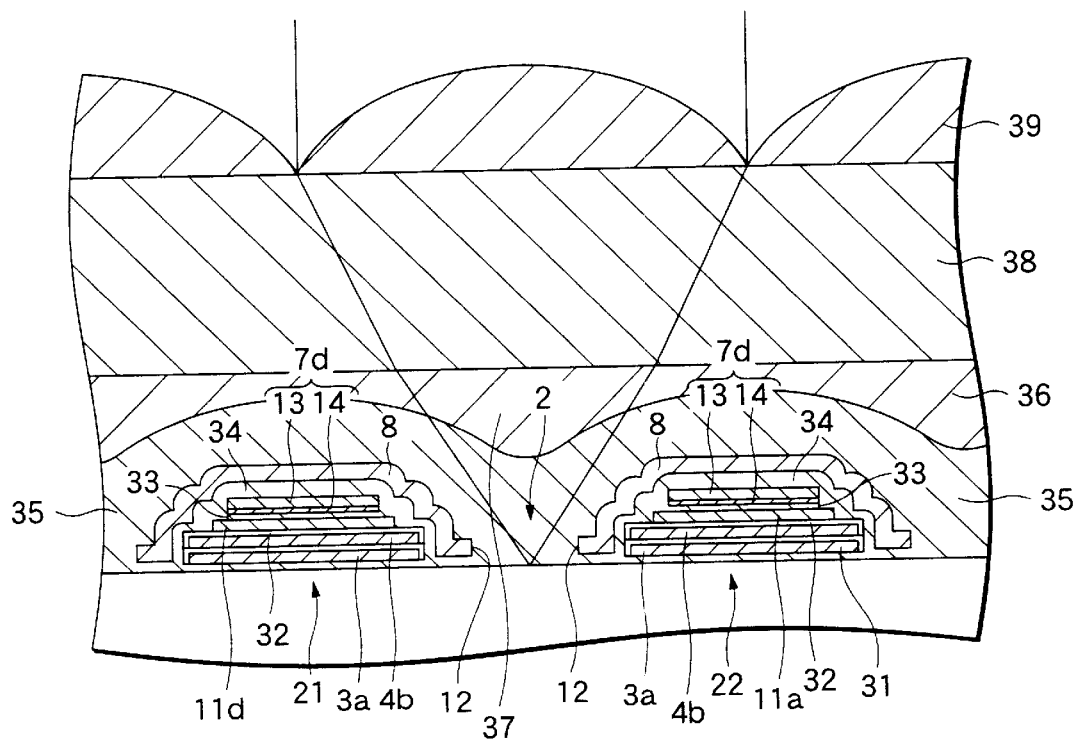
FIG. 3 is a cross sectional view on line A—A in FIG. 2.
Figure 4:
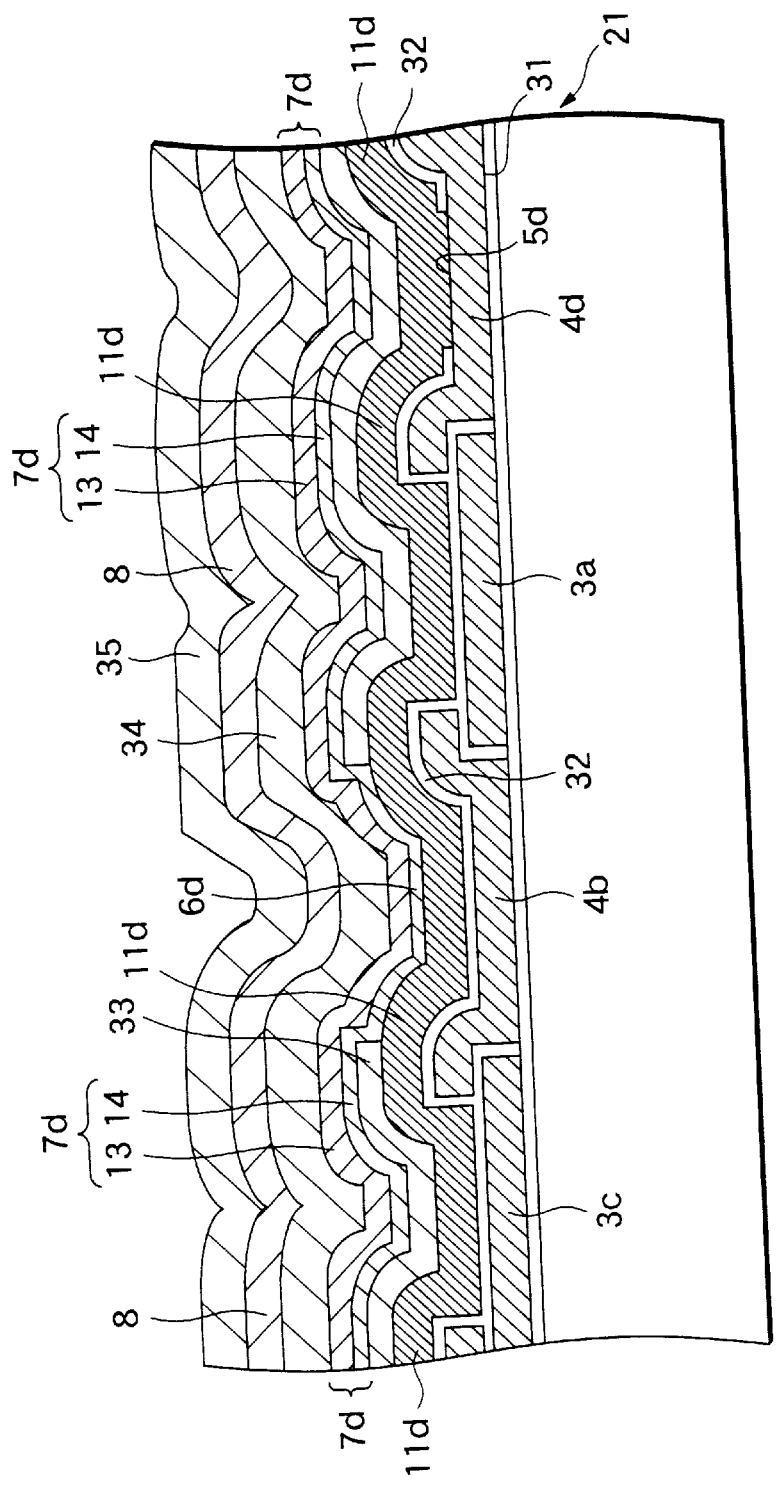
FIG. 4 is a cross sectional view on line B—B in FIG. 2.

The structure the CCD solid image pickup device 10 will be described in detail with reference to FIGS. 2 to 4. FIG. 2 is an enlarged view of the important part corresponding to the two vertical charge transfer parts in FIG. 1, FIG. 3 is a cross sectional view on line A—A in FIG. 2, and FIG. 4 is a cross sectional view on line B—B in FIG. 2.

In FIG. 2, the sensor unit 2 is provided between the two vertical charge transfer parts 21 and 22. As shown in FIGS. 3 and 4, the transfer electrode is provided on the vertical charge transfer parts 21 and 22 through the dielectric film 31. The transfer electrode are formed with the polycrystalline silicon layer 3a of the first layer, to which the clock signal of the first phase φa is supplied, the polycrystalline silicon layer of the second phase φb is supplied, the polycrystalline silicon layer of the first layer 3c, to which the clock signal of the third phase φc is supplied, and the polycrystalline silicon layer 4d of the second layer, to which the clock signal of the fourth phase φd is supplied.

The region between the polycrystalline silicon layers of the first layer 3a and 3c and the sensor unit 2 is a readout part.

The polycrystalline silicon layers of the first layer 3a and 3c and the polycrystalline silicon layers of the second layer 4b and 4d are formed alternately through the dielectric film 32 along the direction of the charge transfer of the vertical charge transfer parts 21 and 22, and at the edge parts of the polycrystalline silicon layers of the first layer 3a and 3c, the polycrystalline silicon layers of the second layer 4b and 4d are provided to overlap thereto.

The buffer layers 11a and 11d have a substantially linear pattern that is lied in the vertical direction (corresponding to the transfer direction) only on the vertical charge transfer parts 21 and 22, and are connected to the polycrystalline silicon layer of the first layer 3a and the polycrystalline silicon layer of the second layer 4d via the contact holes 5a and 5d formed on the dielectric film 32, respectively.

That is, the polycrystalline silicon layer of the first layer 3a and the polycrystalline silicon layer of the second layer 4d as the transfer electrodes are not directly connected to the shunt wiring layers 7 but are connected thereto via the buffer layers 11a and 11d.

The buffer layers 11a and 11d are connected to the respective shunt wiring layers 7a and 7d via the contact holes 6a and 6d formed on the interlevel dielectric film 33, respectively.

As a result, the clock signal of the first phase φa is supplied from the shunt wiring layer 7a to the polycrystalline silicon layer of the first layer 3a via the buffer layer 11a, and the clock signal of the fourth phase φd is supplied from the shunt wiring layer 7d to the polycrystalline silicon layer of the second layer 4d via the buffer layer 11d. The same is applied to the clock signals of the second phase and the third phase.

The light shielding layer 8 is provided on the shunt wiring layers 7a and 7b through the interlevel dielectric film 34 to cover the transfer electrode 3a and 4b. The light shielding layer 8 has an opening 12 on the sensor unit 2, whereby light is incident on the sensor unit 2 through the opening 12, but light is not incident on the transfer electrodes 3a and 4b.

The shielding layer 8 is covered with a dielectric film 35 comprising, for example, BPSG (boron phosphorus silicate glass, refractive index: 1.6), and the dielectric film 35 has a concave part on the sensor unit 2.

A layer of a material having a high refractive index 36 comprising, for example, plasma SiN (refractive index: 1.9) is formed to fill the concave part to form a intralayer lens 37 in the concave part.

The layer of the material having a high refractive index 36 is constituted in such a manner that a material having a refractive index that is at least higher than that of the dielectric film 35 is used, so as to condense the light from the above with the intralayer lens 37.

Furthermore, a flattened dielectric layer 38 having a flattened surface is formed thereon, and an on-chip lens 39 is further formed thereon.

The incident light is condensed by the on-chip lens 39 and the intralayer lens 37 to be incident on the sensor unit 2, and therefore the utilization efficiency of the light can be improved to increase the sensitivity.

A color filter may be formed at a position between the intralayer lens 37 and the on-chip lens 39, i.e., the flattened dielectric layer 38 in FIG. 3, depending on necessity.

In this embodiment, particularly, the shunt wiring layers 7 (7a, 7b, 7c and 7d) is formed with an accumulated film of a high melting point metal layer 13, such as tungsten, molybdenum and tantalum, and a nitride layer of the high melting point metal or an oxide layer of the high melting point metal 14.

The nitride or oxide layer of the high melting point metal 14 is used as an underlayer, and the shunt wiring layers are connected to the buffer layers 11 by the nitride or oxide layers of the high melting point metal 14 via the contact parts 6 (6a, 6b, 6c and 6d), whereby the contact resistance with the polycrystalline silicon layer or the polycide layer of the buffer layer 11 can be decreased, and the reaction between the shunt wiring layer 7 and the buffer layer 11 in conducting the high temperature treatment thereafter can be suppressed.

The light shielding layer 8 is also formed with a high melting point metal, such as tungsten.

Because a high melting point metal is used in the shunt wiring layer 7 and the light shielding layer 8, a heat treatment can be conducted at a high temperature in forming the dielectric films 34 and 35 thereafter.

Furthermore, since tungsten is good in light shielding property, coverage and withstand voltage as an interlevel dielectric film, the shunt wiring layer 7 and the light shielding layer 8 can be formed with a small thickness.

Therefore, the total thickness of the image pickup device to the upper end of the light shielding layer 8 can be reduced, and as a result, the sensitivity shading is improved.

The dielectric film 35 on the light shielding layer 8 is formed by a heat treatment at a high temperature of from 800 to 900° C. after forming the dielectric film 35 as will be described later.

The dielectric film 35 is subjected to reflow by the heat treatment and is formed to have such a shape that has the concave parts for forming the intralayer lenses 37 on the surface.

In the case where Al is used in the shunt wiring layer, the dielectric film 35 cannot have such a shape that has the concave part constituting refraction surface of the intralayer lens 37 by being subjected to reflow because it cannot be subjected to the high temperature heat treatment.

In this embodiment, on the other hand, because the shunt wiring layer using the high melting point metal and a nitride or an oxide thereof can be subjected to the high temperature heat treatment, the intralayer lens 37 can be formed to condense the incident light.

The solid image pickup device 10 having the shunt wiring layer 7 having the two-layer structure can be produced, for example, by the following process.

The polycrystalline silicon layer of the first layer is accumulated on the dielectric film 31 covering a semiconductor substrate, and then is patterned to the prescribed pattern to form the transfer electrodes 3 comprising the polycrystalline silicon layer of the first layer.

Thereafter, the dielectric layer 32 is formed to cover the transfer electrodes 3 comprising the polycrystalline silicon layer of the first layer, and then the polycrystalline silicon layer of the second layer is accumulated and patterned to the prescribed pattern to form the transfer electrodes 4 comprising the polycrystalline silicon layer of the second layer.

The dielectric film 32 is formed to cover the transfer electrodes 4 comprising the polycrystalline silicon layer of the second layer.

The openings for the contact parts 5 are formed in the dielectric film 32 at the positions above the transfer electrodes 3a, 4b, 3c and 4d.

Thereafter, the buffer layer 11, for example a polycrystalline silicon layer, is accumulated to cover the entirety including the openings for the contact parts 5. It is then patterned to a linear form shown in FIG. 1 to form the buffer layer 11.

The dielectric film 33 is then formed to cover the buffer layer 11, and the openings for the contact parts 6 are formed in the dielectric film 33 at the positions remote from the contact parts 5 of the buffer layer 11.

The nitride layer or the oxide layer of the high melting point metal 14, such as tungsten, is formed to cover the entirety including the openings for the contact parts 6, and the high melting point metal layer 12 is formed by accumulating thereon. The accumulated layer thus formed is then patterned to a linear form as similar to the buffer layer, so as to form the shunt wiring layer 7.

The dielectric film 34 is then formed to cover the shunt wiring layer 7, and the light shielding layer 8 comprising a high melting point metal, such as tungsten, is formed on the dielectric layer 34.

The light shielding layer 8 has the openings on the sensor units 2, whereby light is incident only on the sensor units.

The dielectric film 35 comprising, for example, BPSG is formed on the light shielding layer 8 to cover the same. The dielectric film 35 is then subjected to a heat treatment.

The conditions for the heat treatment are preferably at a temperature of from 800 to 900° C. for 5 minutes or more, and more preferably, the treatment time is from 5 minutes to 1 hour.

The dielectric film 35 on the light shielding layer 8 having the surface form along the steps of the light shielding layer 8 is subjected to reflow by the treatment, so as to have such a surface form that has the concave parts shown in FIG. 3.

The defects on the surface of the silicon substrate caused by receiving damages by pattern etching and the like can be recovered by the heat treatment.

In the conventional case where the wiring is provided by forming an underlayer of a high melting point metal film and then forming a nitride film of the high melting point metal, a short heat treatment at 850° C. for 1 minute is conducted by lamp annealing, but the defects cannot be sufficiently recovered by the lamp annealing, and the dielectric film 35 cannot be subjected to reflow.

The layer of the material having a high refractive index 36, for example, plasma SiN, is formed on the dielectric film 35, so as to form the intralayer lenses 37 on the concave parts of the dielectric film 35.

Thereafter, the flattened dielectric layer 38 for flattening the upper surface and the on-chip lenses 39 are formed to produce the CCD solid image pickup device 10.

According to the manner described in the foregoing, such a constitution can be conveniently produced that the buffer layer 11 is provided between the transfer electrode 4 and the shunt wiring layer 7, and the intralayer lens 37 is formed on the sensor unit 2.

According to the embodiment, because the shunt wiring layer 7 is formed with the accumulated film comprising the high melting point metal layer 13 and the nitride layer or the oxide layer of the high melting point metal as the underlayer thereof, the reaction between the shunt wiring layer 7 and the buffer layer 11 can be suppressed, so as to avoid the problem in that the contact resistance between the high melting point metal of the transfer electrode or the accumulation electrode and the shunt wiring layer 7 or the buffer layer 11 is increased.

According to the embodiment, because the high melting point metal, such as tungsten, is used in the shunt wiring layer 7 and the light shielding layer 8, the heat treatment can be conducted at a temperature of from 800 to 900° C. for a period of time of 5 minutes or more even after forming the dielectric film 35 on the light shielding layer 8, and thus the dielectric film 35 can be formed to have such a surface form that has the concave part for forming the intralayer lens 37.

According to the constitution, the incident light can be condensed by forming the intralayer lens 37, whereby the sensitivity can be increased, and the formation of smear can be reduced.

Because the defects of the substrate caused by reception of damages can be recovered through the above heat treatment, whereby the formation of dark current can be reduced.

According to the embodiment, the shunt wiring layer 7 comprising the high melting point metal is provided by being made in contact with the transfer electrodes 3 and 4 via the buffer layer 11, whereby the resistance of the transfer electrodes 3 and 4 can be decreased to reduce the propagation delay.

Because the propagation delay is reduced, the operation speed of the solid image pickup device can be increased, and the transfer in a long distance can be conducted, whereby an image pickup device with a large area can be realized.

Furthermore, because the resistance can be decreased by the shunt wiring layer 7, increase in resistance can be suppressed even when the transfer electrodes 3 and 4 are made thin, whereby the thickness of the solid image pickup device can be reduced. Therefore, the height from the sensor unit 2 to the upper end of the light shielding layer 8 can be reduced to improve the utilization efficiency of light.

Moreover, even when the intralayer lens 37 is formed, it is possible that the thickness of the solid image pickup device is not increased to a large extent.

While the embodiment has been described as the transfer clock is of four phases, it may be multi-phase of two or more phases and is not particularly limited. The image pickup apparatus, in which the solid image pickup device is used, is not limited to a flame interline type and may be an interline type.

The contact parts 6 between the buffer layer 11 and the shunt wiring layer 7 may be formed to connect to the buffer layer 11, and such a constitution is also possible that they are formed on the contact parts 5 between the buffer layer 11 and the transfer electrodes 3 and 4. In other words, the contact parts 5 and the contact parts 6 may be formed at the same positions.

While the shunt wiring layer 7 is formed under the light shielding layer 8 in the embodiment, such a constitution is also possible that it is formed as an upper layer of the light shielding layer 8. In this case, in order to connect the shunt wiring layer 7 and the buffer layer 11, it has such a pattern that the light shielding layer 8 is removed in the vicinity of the contact part 6.

As described in the foregoing, it is possible to form the buffer layer 11 as the two-layer structure of the polycrystalline silicon layer 15 and the metallic silicide layer 16, i.e., the so-called polycide.

Figure 5:
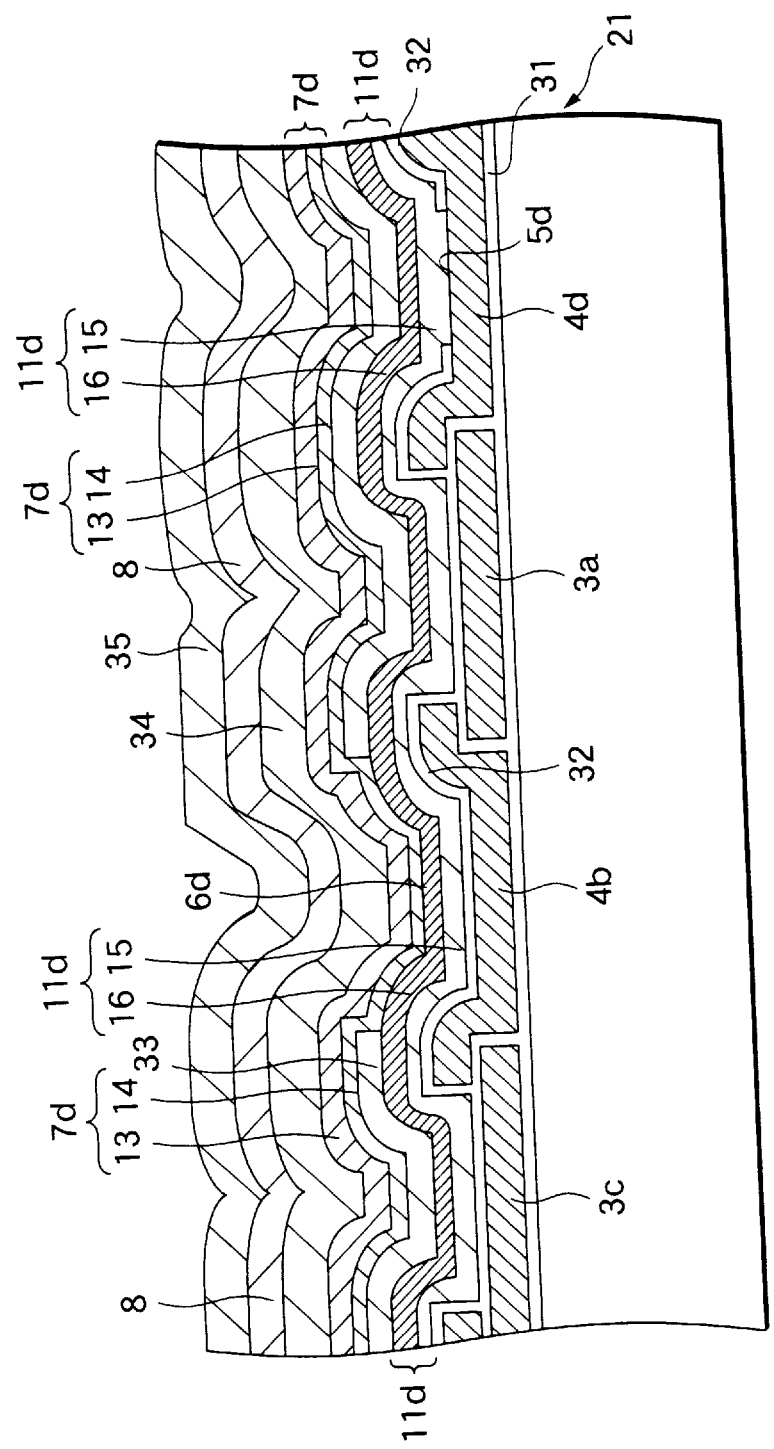
FIG. 5 is a cross sectional view of an embodiment where the buffer layer is formed with a polysilicide film.
Figure 6:
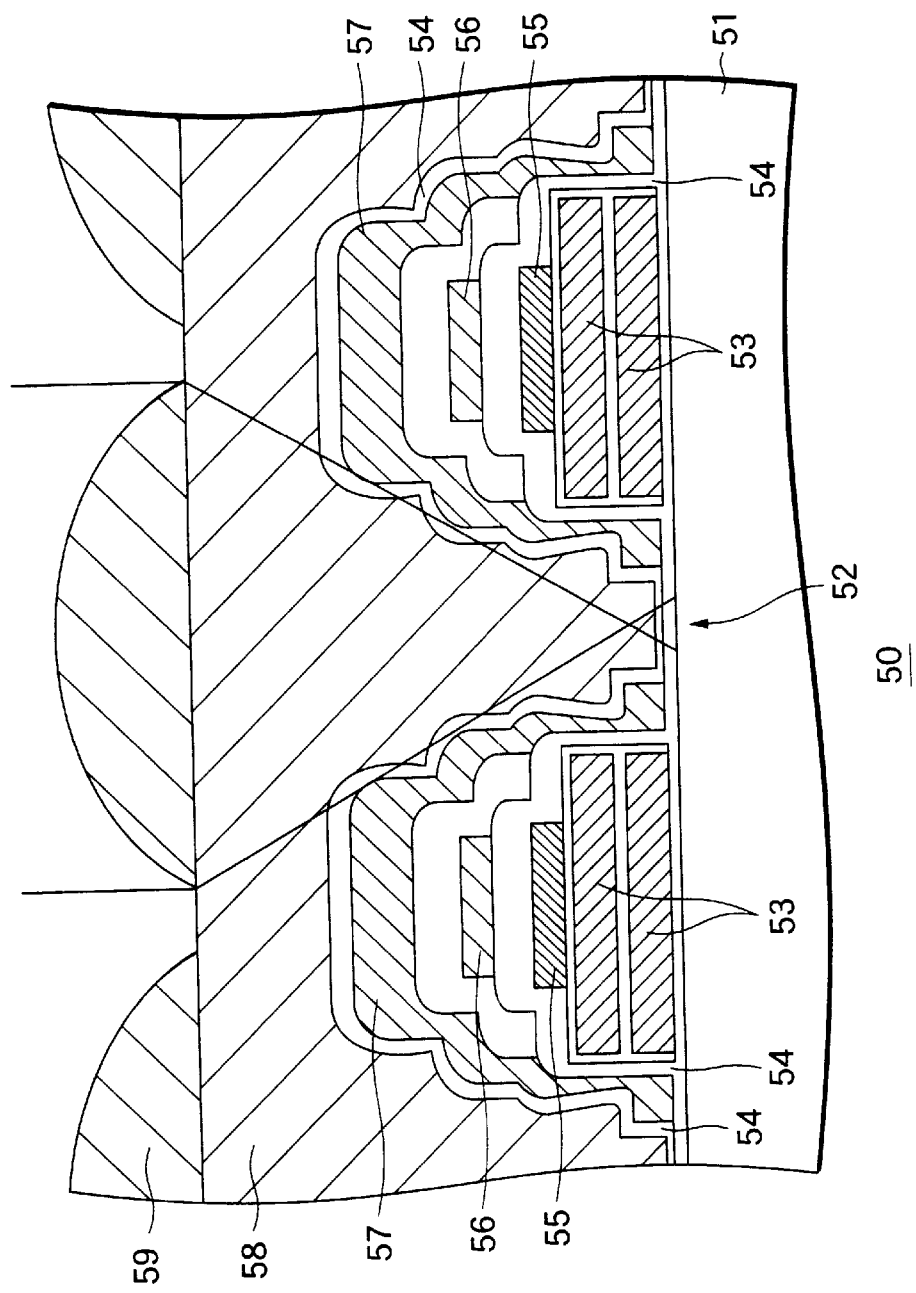
FIG. 6 is a cross sectional view of the vicinity of a photo sensor unit of a CCD solid image pickup device having a shunt wiring layer formed therein.

The cross sectional view in this case is shown in FIG. 5.

In this case, the contact resistance can be sufficiently decreased by the transfer electrodes 3 and 4 comprising the polycrystalline silicon layer and the polycrystalline silicon layer 15 of the buffer layer 11.

While the shunt wiring layer 7 is connected to the transfer electrodes 3 and 4 via the buffer layer 11 in the foregoing embodiment, the invention can be applied to the constitution in that the shunt wiring layer is directly connected to the transfer electrode. When the shunt wiring layer is formed with a nitride layer or an oxide layer of the high melting point metal as an under layer of a high melting point metal layer by applying the invention, the reaction between the polycrystalline silicon of the transfer electrode and the shunt wiring layer on the heat treatment can be suppressed.

Furthermore, while such a constitution that the intralayer lens 37 is formed on the sensor unit 2 is described in the foregoing embodiment, a heat treatment at a high temperature can be conducted even in the constitution having no intralayer lens 37 provided by applying the invention. Because the defects on the surface of the substrate can be recovered by the heat treatment, the formation of dark current can be suppressed.

The invention is not limited to the embodiments described in the foregoing, and various constitutions are possible unless it deviates from the gist of the invention.

According to the invention, by using the shunt wiring layer formed with the accumulated film comprising a high melting point metal and a nitride or an oxide of a high melting point metal, the resistance of the transfer electrode can be decreased.

Therefore, according to the invention, the propagation delay can be reduced by decreasing the contact resistance of the wiring, and thus the high-speed operation and a device having a large area can be realized.

Furthermore, in the invention, the heat treatment at a high temperature of from 800 to 900° C. can be conducted upon production owing to the use of the high melting point metal in the shunt wiring layer, and by conducting the heat treatment, the defects on the surface of the substrate can be recovered to suppress the formation of dark current.

According to the invention, because the shunt wiring layer is formed with the accumulated film comprising the nitride layer or the oxide layer of the high melting point metal having the high melting point metal layer formed thereon, the reaction between the transfer electrode and the like and the shunt wiring layer can be suppressed by the nitride layer or the oxide layer of the high melting point metal, and thus the resistance of the transfer electrode can be decreased with suppressing the increase in contact resistance to the transfer electrode and the like.

Furthermore, in the case where the intralayer lens is provided with the material having a high refractive index on the sensor, the incident light can be condensed to be incident on the sensor, so as to improve the sensitivity and to decrease smear.

In particular, the concave part can be formed in the dielectric film by the heat treatment at a temperature of from 800 to 900° C. to easily form the intralayer lens.

According to the invention, because the shunt wiring layer is formed, and the high melting point metal is used in the shunt wiring layer, the thickness of the transfer electrode can be reduced, and the thickness of the shunt wiring can also be reduced, whereby the thickness of the solid image pickup device can be reduced, so as to improve the sensitivity shading and to increase the sensitivity.

Furthermore, the increase of the thickness of the solid image pickup device when the intralayer lens is provided can be suppressed.

What is claimed is:

1. A solid state laser pickup device comprising:
   a plurality of sensor units formed on a substrate;
   a transfer electrode provided among said sensor units on said substrate; and
   a shunt wiring electrically connected to said transfer electrode,
   said shunt wiring comprising an upper shunt layer comprising a high melting point metal and a lower shunt layer comprising a nitride or an oxide of a high melting point metal.

2. A solid image pickup device as claimed in claim 1, wherein said upper shunt layer is provided on said lower shunt layer.

3. A solid image pickup device as claimed in claim 1, wherein said device further comprises intralayer lenses on said sensor units.

4. A solid image pickup device as claimed in claim 3, wherein said device further comprises a dielectric film between the sensor units and said intralayer lenses.

5. A solid image pickup device as claimed in claim 4, wherein said dielectric film comprises BPSG.

6. A solid image pickup device as claimed in claim 1, wherein said device further comprises a buffer layer between said transfer electrode and said shunt wiring electrically connected thereto.

* * * * *

UNITED STATES PATENT AND TRADEMARK OFFICE
CERTIFICATE OF CORRECTION

PATENT NO. : 6,504,188 B1  
APPLICATION NO. : 09/708811  
DATED : January 7, 2003  
INVENTOR(S) : Yasushi Maruyama and Dai Sugimoto It is certified that error appears in the above-identified patent and that said Letters Patent is hereby corrected as shown below:

Column 10 lines 57-67 in the claims:
"1. A solid state laser pickup device comprising:
a plurality of sensor units formed on a substrate;
a transfer electrode provided among said sensor units on said substrate; and
a shunt wiring electrically connected to said transfer electrode,
said shunt wiring comprising an upper shunt layer comprising a high melting point metal and a lower shunt layer comprising a nitride or an oxide of a high melting point metal."

Column 10 lines 57-67
should read

--1. A solid image pickup device comprising:
a plurality of sensor units formed on a substrate;
a transfer electrode provided among said sensor units on said substrate; and
a shunt wiring electrically connected to said transfer electrode,
said shunt wiring comprising an upper shunt layer comprising a high melting point metal and a lower shunt layer comprising a nitride or an oxide of a high melting point metal.--.

Signed and Sealed this

First Day of July, 2008

JON W. DUDAS  
*Director of the United States Patent and Trademark Office*